(12) United States Patent
Chen et al.

(10) Patent No.: US 9,997,253 B1
(45) Date of Patent: Jun. 12, 2018

(54) NON-VOLATILE MEMORY ARRAY WITH MEMORY GATE LINE AND SOURCE LINE SCRAMBLING

(71) Applicant: Cypress Semiconductor Corporation, San Jose, CA (US)

(72) Inventors: Chun Chen, San Jose, CA (US); Yoram Betser, Mazkeret Batya (IL); Kuo-Tung Chang, Saratoga, CA (US); Amichai Givant, Rosh Ha'Ayin (IL); Shivananda Shetty, San Jose, CA (US); Shenqing Fang, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days. days.

(21) Appl. No.: 15/471,418

(22) Filed: Mar. 28, 2017

Related U.S. Application Data

(60) Provisional application No. 62/431,582, filed on Dec. 8, 2016.

(51) Int. Cl.
| | |
|---|---|
| *G11C 16/04* | (2006.01) |
| *G11C 16/34* | (2006.01) |
| *G11C 11/56* | (2006.01) |
| *G11C 16/10* | (2006.01) |
| *H01L 27/115* | (2017.01) |

(52) U.S. Cl.
CPC ...... *G11C 16/3427* (2013.01); *G11C 11/5628* (2013.01); *G11C 11/5642* (2013.01); *G11C 16/0483* (2013.01); *G11C 16/10* (2013.01); *H01L 27/115* (2013.01)

(58) Field of Classification Search
CPC .... G11C 16/0483; G11C 16/10; H01L 27/115
USPC ........................................ 365/185.17, 185.01
See application file for complete search history.

(56) References Cited

U.S. PATENT DOCUMENTS

| | | | |
|---|---|---|---|
| 5,706,228 A | 1/1998 | Chang et al. | |
| 5,721,704 A | 2/1998 | Morton | |
| 5,945,717 A | 8/1999 | Chevallier | |
| (Continued) | | | |

FOREIGN PATENT DOCUMENTS

EP     1599881 B1    12/2010

OTHER PUBLICATIONS

USPTO Non-Final Rejection for U.S. Appl. No. 15/279,194 dated Jul. 28, 2017; 15 pages.

(Continued)

*Primary Examiner* — Jason Lappas

(57) ABSTRACT

A memory device includes a memory array arranged in rows and columns. The memory array may have at least four non-volatile memory (NVM) cells coupled in the same column of the memory array, in which each NVM cell may include a memory gate. The first and second NVM cells of the at least four NVM cells may share a first source region, and the third and fourth NVM cells may share a second source region. The memory gates of the first and second NVM cells may not be electrically coupled with one another, and the first and second source regions may not be electrically coupled with one another. Each of the first and second source regions may be electrically coupled with at least another source region of the same column in the memory array.

21 Claims, 13 Drawing Sheets

(56) References Cited

U.S. PATENT DOCUMENTS

| | | | |
|---|---|---|---|
| 5,978,267 A | 11/1999 | Chen et al. | |
| 6,400,603 B1 | 6/2002 | Blyth et al. | |
| 6,438,028 B1 | 8/2002 | Kobayashi et al. | |
| 6,587,381 B2 | 7/2003 | Kanai et al. | |
| 6,717,846 B1 | 4/2004 | Lee et al. | |
| 7,110,295 B2 | 9/2006 | Ishikawa et al. | |
| 7,130,223 B2 | 10/2006 | Ishimaru et al. | |
| 7,253,055 B2 | 8/2007 | Mokhlesi et al. | |
| 7,269,063 B2 | 9/2007 | Chih | |
| 7,286,401 B2 | 10/2007 | Ishimaru et al. | |
| 7,339,827 B2 * | 3/2008 | Yasui | G11C 16/0466 257/E27.103 |
| 7,667,259 B2 | 2/2010 | Yasui et al. | |
| 7,696,038 B1 | 4/2010 | Cheng et al. | |
| 7,952,937 B2 | 5/2011 | Bode | |
| 7,974,127 B2 | 7/2011 | Chong et al. | |
| 8,045,373 B2 | 10/2011 | Jenne et al. | |
| 8,164,950 B2 | 4/2012 | Torsi et al. | |
| 8,174,901 B2 | 5/2012 | Matsubara et al. | |
| 8,492,826 B2 | 7/2013 | Ajika et al. | |
| 8,497,547 B2 | 7/2013 | Toba et al. | |
| 9,123,425 B2 | 9/2015 | Dong et al. | |
| 9,443,579 B2 | 9/2016 | Lee | |
| 9,455,352 B2 | 9/2016 | Cheng et al. | |
| 9,508,430 B2 | 11/2016 | Murooka | |
| 9,570,079 B1 | 2/2017 | Gorthi et al. | |
| 9,590,059 B2 | 3/2017 | Chuang et al. | |
| 9,673,210 B1 | 6/2017 | Thees et al. | |
| 2003/0034510 A1 | 2/2003 | Liu et al. | |
| 2003/0039146 A1 | 2/2003 | Choi | |
| 2003/0145154 A1 | 7/2003 | Barnett et al. | |
| 2004/0027856 A1 | 2/2004 | Lee et al. | |
| 2005/0017287 A1 | 1/2005 | Chih et al. | |
| 2005/0135155 A1 | 6/2005 | Ishimaru et al. | |
| 2005/0179079 A1 | 8/2005 | Wu | |
| 2005/0185464 A1 | 8/2005 | Chih | |
| 2006/0028868 A1 | 2/2006 | Okazaki et al. | |
| 2006/0083089 A1 | 4/2006 | Chevallier | |
| 2007/0070703 A1 | 3/2007 | Tran et al. | |
| 2007/0086247 A1 | 4/2007 | Lutze et al. | |
| 2008/0247255 A1 | 10/2008 | Syzdek et al. | |
| 2009/0050956 A1 | 2/2009 | Ishimaru et al. | |
| 2011/0157982 A1 | 6/2011 | Lee et al. | |
| 2012/0063223 A1 | 3/2012 | Lee et al. | |
| 2012/0139025 A1 | 6/2012 | Gely et al. | |
| 2012/0147651 A1 | 6/2012 | Scheuerlein et al. | |
| 2013/0034313 A1 | 2/2013 | Lin et al. | |
| 2013/0088916 A1 | 4/2013 | Sarpatwari et al. | |
| 2013/0250687 A1 | 9/2013 | Chan | |
| 2013/0343123 A2 | 12/2013 | Kim | |
| 2014/0104965 A1 | 4/2014 | Tran et al. | |
| 2014/0119121 A1 | 5/2014 | Aritome | |
| 2014/0269058 A1 | 9/2014 | Liu et al. | |
| 2015/0287732 A1 | 10/2015 | Tsao et al. | |
| 2015/0303208 A1 | 10/2015 | Kim et al. | |
| 2015/0325300 A1 | 11/2015 | Kim et al. | |
| 2016/0125945 A1 | 5/2016 | Maejima | |
| 2016/0225453 A1 | 8/2016 | Kashihara | |
| 2016/0314846 A1 | 10/2016 | Muller et al. | |
| 2017/0194056 A1 | 7/2017 | Heinrich-Barna et al. | |

OTHER PUBLICATIONS

U.S. Appl. No. 15/279,194: "Methods and Devices for Reducing Program Disturb in Non-Volatile emory Cell Arrays" Amichai Givant et al., filed Sep. 28, 2016; 29 pages.

International Search Report for International Application No. PCT/US17/17452 dated Apr. 28, 2017; 2 pages.

Rohit S Shenoy, et al., "MIEC (mixed-ionic-electronic-conduction)-based access devices for non-volatile crossbar memory arrays," IOP Publishing, Semicond. Sci. Technol. 29, 104005, Sep. 18, 2014; pp. 1-11; 11 pages.

Sung-Jin Choi and Yang-Kyu Choi, "Source and Drain Junction Engineering for Enhanced Non-Volatile Memory Performance," INTECH, Sep. 6, 2011, pp. 177-197; 7 pages.

USPTO Non Final Rejection for U.S. Appl. No. 15/279,194 dated Dec. 30, 2016; 16 pages.

USPTO Notice of Allowance for U.S. Appl. No. 15/279,194 dated Mar. 29, 2017; 8 pages.

Written Opinion of the International Searching Authority for International Application No. PCT/US17/17452 dated Apr. 28, 2017; 5 pages.

Yoshio Nishi, "Advances in Non-volatile Memory and Storage Technology," Woodhead Publishing Series in Electronic and Optical Materials, No. 64, pp. 7; 1 page.

USPTO Non-Final Office Action for U.S. Appl. No. 15/279,194 dated Dec. 29, 2017; 9 pages.

International Search Report for International Application No. PCT/US17/46698 dated Nov. 3, 2017; 2 pages.

Written Opinion of the International Searching Authority for International Application No. PCT/US17/46698 dated Nov. 3, 2017; 6 pages.

USPTO Notice of Allowance for U.S. Appl. No. 15/279,194 dated Apr. 9, 2018; 8 pages.

\* cited by examiner

NON-VOLATILE MEMORY ARRAY WITH MEMORY GATE LINE AND SOURCE LINE SCRAMBLING

PRIORITY

The present application claims the priority and benefit under 35 U.S.C. § 119(e) of U.S. Provisional Application No. 62/431,582, filed on Dec. 8, 2016, which is incorporated by reference herein in its entirety.

TECHNICAL FIELD

The present disclosure relates generally to a non-volatile memory (NVM) device, and more particularly, to methods and embodiments of grouping and connecting source lines and memory gate lines to reduce effects of program disturb.

BACKGROUND

Memory that retains its data even when operation power is not available is classified as non-volatile memory. Examples of non-volatile memory are nvSRAM, ferroelectric RAM (F-RAM), programmable-read-only memory (PROM), erasable-programmable-read-only memory (EPROM), electrically-erasable-programmable-read-only-memory (EEPROM), and flash memories. Some memory arrays utilize transistors and gate structures which may include a charge trapping layer. The charge trapping layer may be programmed to store data based on voltages applied to or received by the memory array. This class of memory may be used in applications in which critical data must be stored after power is removed, or when power is interrupted during operation.

BRIEF DESCRIPTION OF THE DRAWINGS

The present disclosure is illustrated by way of example, and not by way of limitation, in the FIGS. of the accompanying drawings.

DETAILED DESCRIPTION

Figure 1:
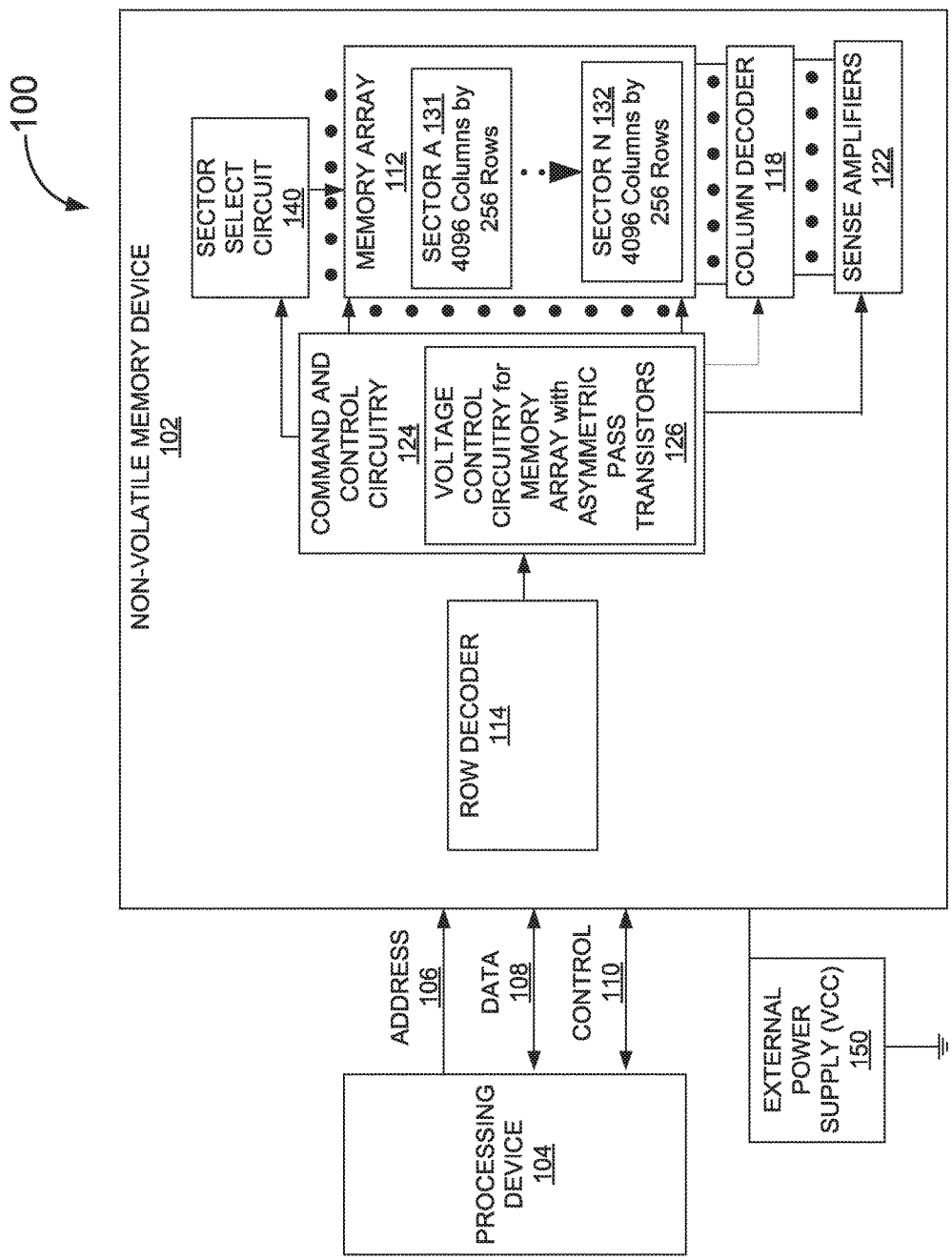
FIG. 1 is a schematic diagram illustrating an NVM system in accordance with one embodiment of the subject matter.

The following description sets forth numerous specific details such as examples of specific systems, components, methods, and so forth, in order to provide a good understanding of several embodiments of the subject matter. It will be apparent to one skilled in the art, however, that at least some embodiments may be practiced without these specific details. In other instances, well-known components or methods are not described in detail or are presented in a simple block diagram format in order to avoid unnecessarily obscuring the techniques described herein. Thus, the specific details set forth hereinafter are merely exemplary. Particular implementations may vary from these exemplary details and still be contemplated to be within the spirit and scope of the subject matter.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Summary of Subject Matter

According to one embodiment, a memory device of the subject matter may include a memory array arranged in rows and columns. The memory array may have at least four non-volatile memory (NVM) cells coupled or connected in the same column of the memory array, in which each NVM cell may include a memory gate. In one embodiment, the connection may be along the source/drain path of the NVM cells. The first and second NVM cells of the at least four NVM cells may share a first source region and the third and fourth NVM cells may share a second source region. In one embodiment, the memory gates of the first and second NVM cells may not be electrically coupled with one another and the first and second source regions may not be electrically coupled with one another. Each of the first and second source regions may be electrically coupled with at least another source region in the same column of the memory array.

In one embodiment, the memory array may be formed, at least partly, by connecting multiple NVM cells, such as the aforementioned at least four NVM cells, to form a first column. In one embodiment, the pattern of the first column may be duplicated in other columns of the memory array.

In some alternative embodiments, the configurations and connections of the rows and columns of the aforementioned memory array may be reversed.

In one embodiment, the aforementioned first and second NVM cells may have a mirrored orientation such that the first and second memory gates may face or disposed adjacent to one another, and the first source region may be disposed between the first and second memory gates.

In one embodiment, some of the aforementioned at least four NVM cells may be a split gate memory cell. In another embodiment, NVM cells may be 2T memory cells having a MOSFET and a SONOS transistor. In another embodiment, the NVM cells may include a floating gate type transistor.

In one embodiment, when the first memory cell is selected for a program operation whereas the second memory cell is not, the first and second memory gates may be configured to receive a high voltage and a low voltage from two different memory gate driver circuits, respectively.

In one embodiment, when the second memory cell is selected for a program operation whereas the third memory cell is not, the second and third memory gates may be configured to receive a high voltage provided by one memory gate line driver. The first and second source regions may be configured to receive a high and a low source voltages, respectively from two different source line driver circuits. In one embodiment, the high voltage provided to the memory gate may be in an approximate range of 5 V to 10 V, and the low voltage in an approximate range of 0 V to 5 V.

According to one embodiment, a memory array of the subject matter may include non-volatile memory (NVM) cells arranged in rows and columns, which each NVM cell may have a memory gate and a select gate. In one embodiment, two adjacent NVM cells of the same column that share a source region disposed between the two memory gates may form an NVM pair, and multiple NVM pairs of the same column may be coupled to one another. In one embodiment, the coupling is along the source/drain path of the NVM cells of the same column. In one embodiment, at least two memory gates of NVM cells of the same row may share a memory gate line, and at least two source regions of NVM cells of the same row may share a source line. In one embodiment, the memory array may further have source line connection routing that is configured to connect multiple source lines electrically to form multiple source line groups, and the multiple source lines in the same source line group are not physically adjacent to one another.

In one embodiment, at least two select gates of NVM cells of the same row may share a select gate line, and at least two drain regions of NVM cells of the same column may share a bit line, in which the drain region of each of the NVM cells is disposed adjacent to its corresponding select gate.

In one embodiment, each of the multiple source line groups may be coupled with a separate source line driver circuit, and may be configured to receive a separate source voltage.

In one embodiment, the memory array of the subject matter may further have memory gate connection routing that may be configured to connect multiple memory gate lines electrically to form multiple memory gate line groups, and the multiple memory gate lines in the same memory gate line group do not share any source line or any source line group. In one embodiment, each of the multiple memory gate line groups may be coupled with a separate memory gate line driver circuit, and may be configured to receive a separate memory gate voltage. In one embodiment, NVM cells of the same source line group do not include memory gate lines belong to the same memory gate line group.

In one embodiment, the memory array may be arranged into 2×N rows (N is a natural number). In one embodiment, multiple odd source lines including the $1^{st}$ to $(N-1)^{th}$ source lines may be connected electrically by a first source line connection routing, and multiple even source lines including the $0^{th}$ to $(N-2)^{th}$ source lines may be connected electrically by a second source line connection routing. In one embodiment, the first and second source line connection routings may be coupled to two different source line driver circuits.

In another embodiment, the $0^{th}$ and $(2N-1)^{th}$ memory gate lines may be connected electrically by a first memory gate line connection routing, and at least one remaining odd memory gate line may be connected electrically to its adjacent even memory gate line by one of the second memory gate line connection routings. In one embodiment, the first and at least one of the second memory gate line connection routings may be each coupled to a separate memory gate driver circuit.

In one embodiment, the memory gate connection routing may include metal 1 (M1) connection to the memory gate driver circuit.

According to one embodiment, the method of operating an NVM array of the subject matter may include the following steps of providing or obtaining the NVM array, in which the NVM array may include at least four NVM cells connected in the same columns of the NVM array. In one embodiment, each NVM cell may include a memory gate and a select gate. The first and second NVM cells of the at least four NVM cells may share a first source line, and the third and fourth NVM cells may share a second source line. The first and second source lines may be each electrically coupled with at least another source line that is not physically adjacent to the first and second source lines respectively.

In one embodiment, the method may further have the step of coupling a high select voltage to a first select gate to select the first memory cell for a program operation.

In one embodiment, the method may further have the step of coupling a low select voltage to a second select gate to unselect the second memory cell for the program operation.

In one embodiment, the method may further have the step of coupling a high program voltage to the first memory gate and a low inhibit voltage to the second memory gate.

In one embodiment, the method may further have the step of coupling two different source voltages to the first source line and the second source line from two different source line driver circuits, respectively.

In one embodiment, the memory gates of the second and third NVM cells may be electrically connected, and the first and second source lines may be physically adjacent to one another.

Computers and other processing devices may store information or programs which have been developed or updated in NVM, such as flash memory including NAND and NOR, EEPROM, F-RAM. In the event of a power down, power outage or a mistake, data can be retrieved. FIG. 1 is a block diagram illustrating an NVM system, according to an embodiment. NVM system 100 may include a processing device 104 coupled to NVM device 102 via address bus 106, data bus 108, and control bus 110. It will be appreciated by those skilled in the art that NVM system 100 has been simplified for the purpose of illustration, and not intended to be a complete description. In particular, details of the processing device 104, row decoder 114, column decoder 118, sense amplifiers 122, and command and control circuitry 124, are not described in detail herein. It should be appreciated that NVM system 100 may include all, some, or more components than the embodiment in FIG. 1.

External power supply 150, also referred to as power supply, is coupled to NVM device 102. External power supply 150 may be a power supply external to NVM device 102 and may be used by NVM device 102 to generate voltage signals, such as high voltage (HV) signals that are above the highest voltage of the external power supply 150 or below a lowest voltage of the external power supply 150 (e.g., ground voltage).

Processing device 104 may reside on a common carrier substrate such as, for example, an integrated circuit ("IC") die substrate, a multi-chip module substrate, or the like. Alternatively, the components of processing device 104 may be one or more separate integrated circuits and/or discrete components. In one exemplary embodiment, processing device 104 may be the Programmable System on a Chip (PSoC®) processing device, developed by Cypress Semiconductor Corporation, San Jose, Calif. Alternatively, processing device 104 may be one or more other processing devices known by those of ordinary skill in the art, such as a microprocessor or central processing unit ("CPU"), a controller, special-purpose processor, digital signal processor ("DSP"), an application specific integrated circuit ("ASIC"), a field programmable gate array ("FPGA"), or the like.

NVM device 102 includes memory array 112, such as an NVM array, organized as rows and columns of non-volatile memory cells (not shown in FIG. 1) as described below. Memory array 112 is coupled to row decoder 114 either directly or through command and control circuitry 124 via multiple select lines and read lines (at least one select line and one read line for each row of the memory array). Memory array 112 is further coupled to column decoder 118 via multiple bit lines (one each for each column of the memory array). It will be appreciated that common source lines (CSLs) may be implemented as part of the multiple select lines and read lines and/or the multiple bit lines. Memory array 112 may be coupled to multiple sense amplifiers 122, via column decoder 118, to read multi-bit words therefrom. NVM device 102 further includes command and control circuitry 124 to receive signals from processing device 104 and sends signals to row decoder 114, control column decoder 118, sense amplifiers 122, control sector select circuit 140, and control voltage signals applied to memory array 112. Command and control circuitry 124 includes voltage control circuitry 126 for memory array 112 with pass transistors or select gates to generate and control the voltage signals for operation of NVM device 102. In one embodiment, the voltage signals may be routed through voltage control circuitry 126 to column decoder 118, sense amplifiers 122, and/or sector selector circuit 140. Voltage control circuitry 126 operates to apply appropriate voltages, including high voltage (HV) signals and low voltage (LV) signals, to the memory cells during pre-program, erase, program, read operations, and/or other operations.

Command and control circuitry 124 may be configured to select a first row of memory array 112 for a program operation by applying a voltage to a first select line in the first row and to deselect a second row of the memory array by applying another voltage to a second select line in the second row. Command and control circuitry 124 may be further configured to control column decoder 118 to select a memory cell in the first row for programming by applying a voltage to a first bit line in a first column, and to inhibit an unselected memory cell in the first row from programming by applying another voltage to a second bit line in a second column. Command and control circuitry 124, in particular voltage control circuitry 126, may be further configured to apply a voltage to one or more common source lines that may be coupled to memory cells included in memory cell array 112 as described below.

In one embodiment, as discussed in greater detail below, NVM device 102 may include various memory cells (not shown) configured to store data values. The memory cells may be implemented with a common source line to reduce the overall footprint of each memory cell. Each memory cell may also be compatible with Fowler-Nordheim programming techniques.

Memory array 112 may include one or more NVM sectors, such as sector A 131 though sector N 132. Each sector may have any number of rows and columns of NVM cells, for example 4096 columns and 256 rows. Rows may include multiple NVM cells arranged horizontally. Columns may include multiple NVM cells arranged vertically. Memory array 112 may use a global bit line (GBL) shared by all the sectors of memory array 112. Each column of memory array 112 may have a GBL. For example, a particular GBL for column 0 shared by all of the sectors (e.g., sector A 131 through sector N 132) will be coupled to each row of memory array 112 in column 0 of all the sectors. The GBL is configured to provide voltage signals to the sectors of memory array 112 during program operations and erase operation, but not during read operations.

Memory array 112 may use sector select circuit 140 to couple the GBL to an associated bit line (BL) of a column of a particular sector. Each column in a sector may have an associated BL particular to that sector that is not shared by other sectors. Each column in a sector may have a sector select circuit 140 to selectively couple the GBL to the associated BL. For example, a sector select circuit 140 for column 0 of sector A 131 may be used as a switch to couple the voltage signal on GBL of column 0 of memory array 112 to the BL for column 0 of sector A 131 during erase operations and program operations.

Memory array 112 may also use sector select circuit 140 to couple a column of NVM cells in a sector to sense amplifiers 122 during a read operation. For example, a sector select circuit 140 for column 0 of sector A 131 may be used as a switch to couple the NVM cells of column 0 of sector A to sense amplifiers 122 during a read operation.

It should be appreciated that terms "rows" and "columns" of a memory array are used for purposes of illustration, rather than limitation. In one embodiment, rows are arranged horizontally and columns are arranged vertically. In another embodiment, the terms of rows and columns of memory array 112 may be reversed or used in an opposite sense, or arranged in any orientation.

Figure 2A:
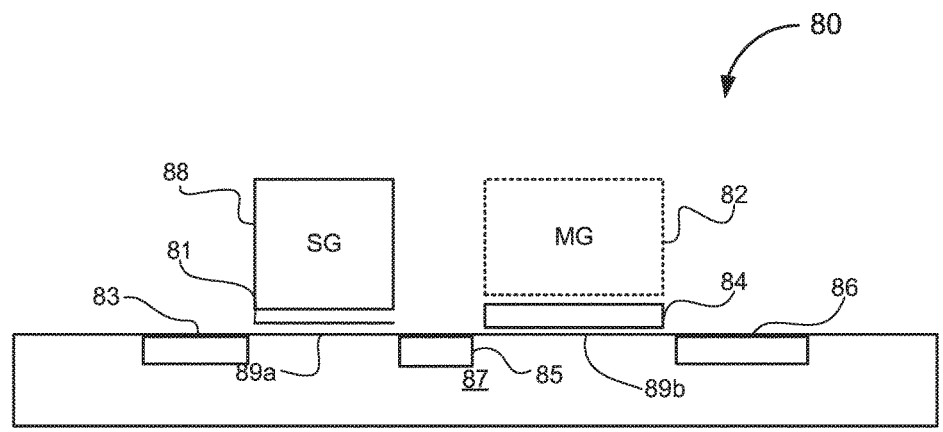
FIG. 2A is a schematic diagram illustrating an NVM cell (two transistor memory cell) in accordance with one embodiment of the subject matter.

As best shown in FIG. 2A, in one embodiment, an NVM cell may be a two-transistor (2T) memory cell 80. In 2T memory cell 80, one transistor may be a memory transistor having memory gate (MG) 82, while another transistor may be a pass transistor or select transistor having select gate (SG) 88. 2T memory cell 80 may also include source or source region 86, drain or drain region 83, SG dielectric layer 81, and optionally drain area 85 between MG 82 and SG 88. The pass transistor may be a field-effect transistor (FET), such as a metal-oxide-semiconductor field-effect transistor (MOSFET), used as a switch to control voltage levels and or current levels at nodes of the NVM cell (e.g., at the source and or drain of pass transistor and or memory transistor). The memory transistor may be a transistor that stores a bit of binary information, for example by varying the charge stored in charge trapping layer 84 of the memory transistor. In other implementations, the NVM cell may include another number of transistors, such as a single memory transistor (1T), a three transistor memory cell, or otherwise.

Figure 2B:
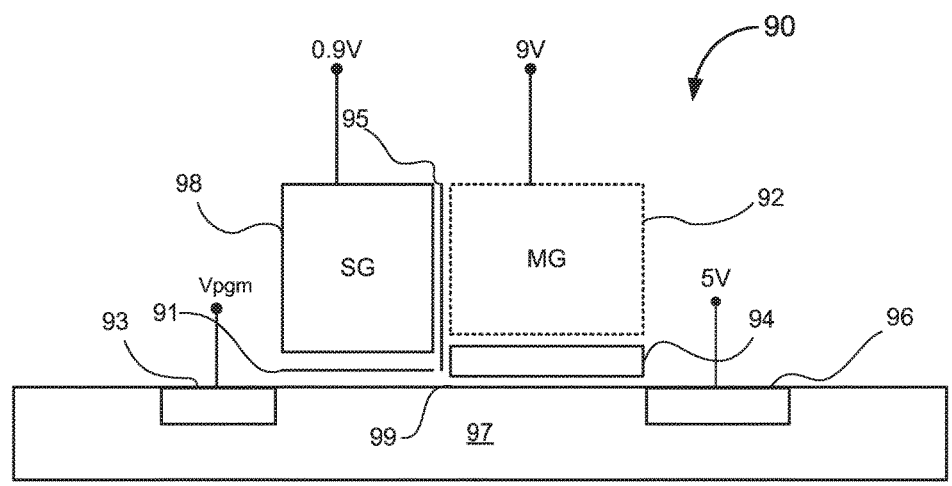
FIG. 2B is a schematic diagram illustrating an NVM cell (split gate memory cell) in accordance with another embodiment of the subject matter

FIG. 2B illustrates a split gate memory cell according to another embodiment of the subject matter. As shown in FIG. 2B, split gate memory cell 90 includes memory gate (MG) 92 disposed adjacent to select gate (SG) 98, in which MG 92 and SG 98 may have a common channel 99 formed in substrate 97, source or source region 96, drain or drain region 93, and SG dielectric layer 91. There may be dielectric layer 95 separating MG 92 and SG 98. Split gate memory cell 90 may also be addressed as a 1.5 transistor (1.5T) memory cell.

In various embodiments, memory array 112 may contain 2T memory cells 80, split gate memory cells 90, a combination thereof, or other types of NVM cells. It will be the understanding that memory array configuration details and operation details discussed in later sections are applicable to at least the 2T memory cell array, split gate memory cell array, and arrays having other combinations of memory cells.

In one embodiment, memory array 112 may be implemented using charge trapping memory transistors. Charge trapping memory transistors may be implemented to utilize transistors and gate structures that include a charge trapping layer, such as charge trapping layer 84 in 2T memory cell 80 or charge trapping layer 94 in split gate memory cell 90. The charge trapping layer may be an insulator that is used to trap charges. The charge trapping layer may be programmed to store data based on voltages applied to or received by the memory array 112. In one embodiment, memory array 112 may include various different NVM cells arranged in rows and columns, and each NVM cell may be capable of storing at least one data value (e.g., bit). Voltages may be applied to each of the NVM cells to pre-program the NVM cell, program the NVM cell (e.g., program operation—store a logic "0" or "1"), erase the NVM cell (e.g., erase operation—store a logic "1" or "0"), or read the NVM cell (e.g., read operation). It should be appreciated that memory array 112 may be implemented using different types of memory transistors, such as floating gate memory transistors.

In one embodiment, the charge trapping memory transistors may be implemented using different materials. One example of a charge trapping memory transistor is a silicon-oxide-nitride-oxide-silicon (SONOS) type transistor. In a SONOS type transistor, the charge trapping layer of the memory transistor may be a nitride layer, such as a layer of silicon nitride. Moreover, the charge trapping layer may also include other charge trapping materials such as silicon oxy-nitride, aluminum oxide, hafnium oxide, hafnium aluminum oxide, zirconium oxide, hafnium silicate, zirconium silicate, hafnium oxy-nitride, hafnium zirconium oxide, lanthanum oxide, or a high-K layer. The charge trapping layer may be configured to reversibly trap or retain carriers or holes injected from a channel of the memory transistor, and may have one or more electrical characteristics reversibly changed, modified, or altered based on voltages applied to NVM cell. In another embodiment, different types of charge trapping memory transistors may be used. For purposes of illustration, and not limitation, the operation of NVM cells in the disclosure will be described with respect to a SONOS type transistor. It should be appreciated that other types of NVM transistors, such as floating gate type transistors, may be implemented using the disclosure herein.

Voltage signals are used in the operation of non-volatile memory (NVM) devices, such as flash memory or phase-change memory. NVM devices may include one or more NVM cells. An NVM cell, such as 2T memory cells 80 or split gate memory cells 90, may be a unit of memory capable of storing a single data value (e.g., a single bit, such as a logical "0" or logical "1").

In one embodiment, a program operation of NVM cells, such as 2T memory cell 80 or split gate memory cell 90, is achieved by injecting channel hot electrons or holes from the source or drain regions. An example of programming split gate memory cell is best shown FIG. 2B. During a program operation, MG 92 and source (S) 96 are both coupled to high voltages (HV) to generate channel hot electrons (example: MG=9V, S=5V). Select gate (SG) is biased above the threshold voltage of the SG transistor (example: SG=0.9V). Consequently, the channel is turned on and electrons may be injected into and trapped in charge trapping layer 94 of the memory transistor.

Some NVM arrays may adopt dedicated source line (DSL) architecture. DSL architecture may include a dedicated source line (SL) and/or SL driver for each NVM cell, column or row of NVM cells in an NVM array (or each column or row of NVM cells in an NVM sector of an NVM array). Similarly, in some embodiments, each memory gate (MG) line may have its dedicated MG driver. One of the main advantages of having DSL drivers and/or dedicated MG driver is to minimize program disturb to unselected (for programming) memory cells, which will be discussed in later sections. However, DSL architecture or dedicated MG drivers may require a large number of additional drivers and connections, causing bigger memory array size and higher chip cost.

Figure 3A:
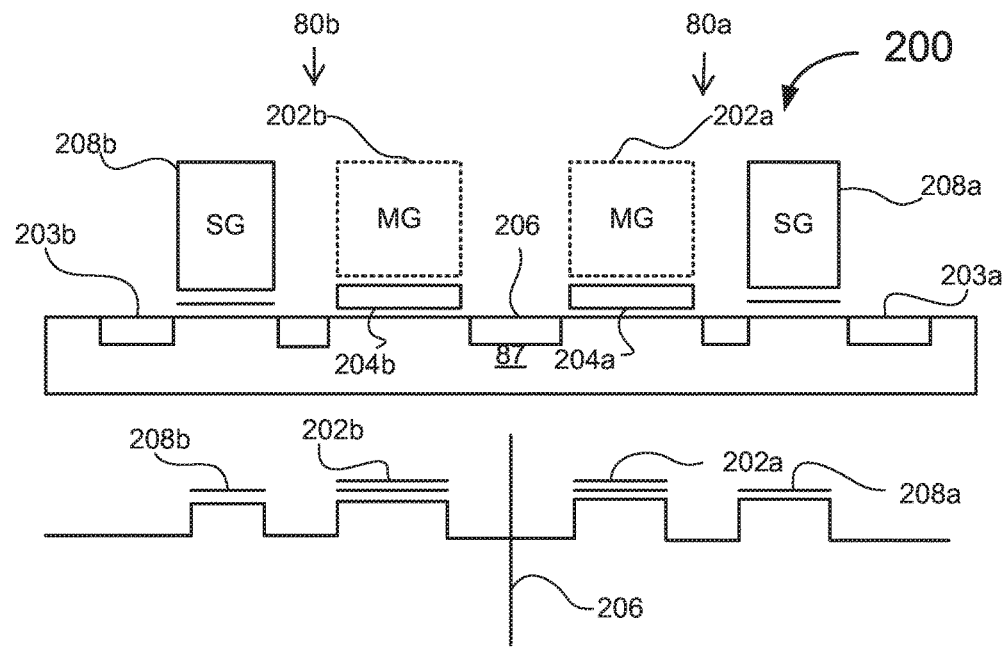
FIG. 3A is a schematic diagram illustrating an NVM pair (two transistor memory cells) in accordance with one embodiment of the subject matter.
Figure 3B:
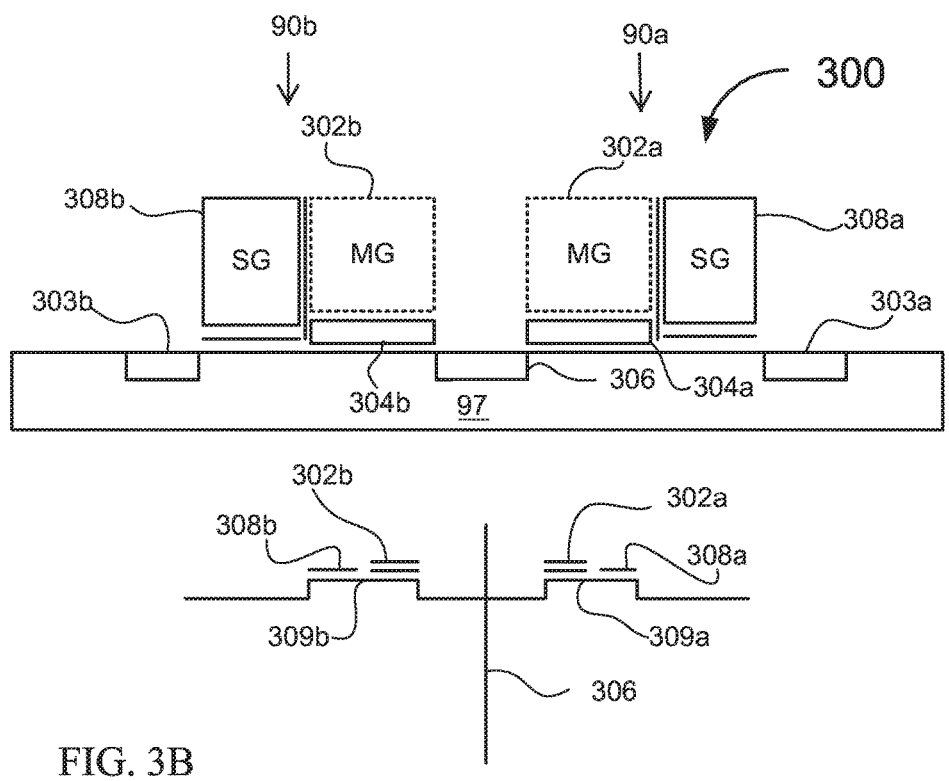
FIG. 3B is a schematic diagram illustrating an NVM pair (split gate memory cells) in accordance with another embodiment of the subject matter.

Common source line (CSL) architecture allows for shared source lines between at least two neighboring NVM cells, and may be extended to couple source lines of multiple rows and/or columns of NVM cells. FIGS. 3A and 3B illustrate two neighboring 2T memory cells and split gate memory cells having a shared SL or CSL, respectively. As best shown in FIG. 3B, two split gate memory cells 90a and 90b are disposed side by side, and having a mirrored orientation to one another. Instead of having each of its own source or SL (e.g. DSL), CSL 306 may be formed between the two adjacent MGs 302a and 302b, forming split gate memory pair 300. Each of the split gate memory cells 90a and 90b may have its own drain 303a and 303b, respectively. Drains 303a and 303b may be coupled to the same or two different bit lines (BLs), according to the layout of the memory array. In some embodiments, MGs 302a and 302b may be coupled to the same MG line driver circuit and configured to receive the same voltage. Referring to FIG. 3A, 2T memory pair 200 may have a similar configuration and connections to split gate memory pair 300, formed by 2T memory cells 80a and 80b. In one embodiment, 2T memory cells 80a and 80b may have each of its own drain 203a and 203b, respectively. Drains 203a and 203b may be coupled to the same or two different bit lines (BLs), according to the layout of the memory array. Instead of having each of its own source or SL (e.g. DSL), CSL 206 may be formed between the two adjacent MGs 202a and 202b.

Figure 4:
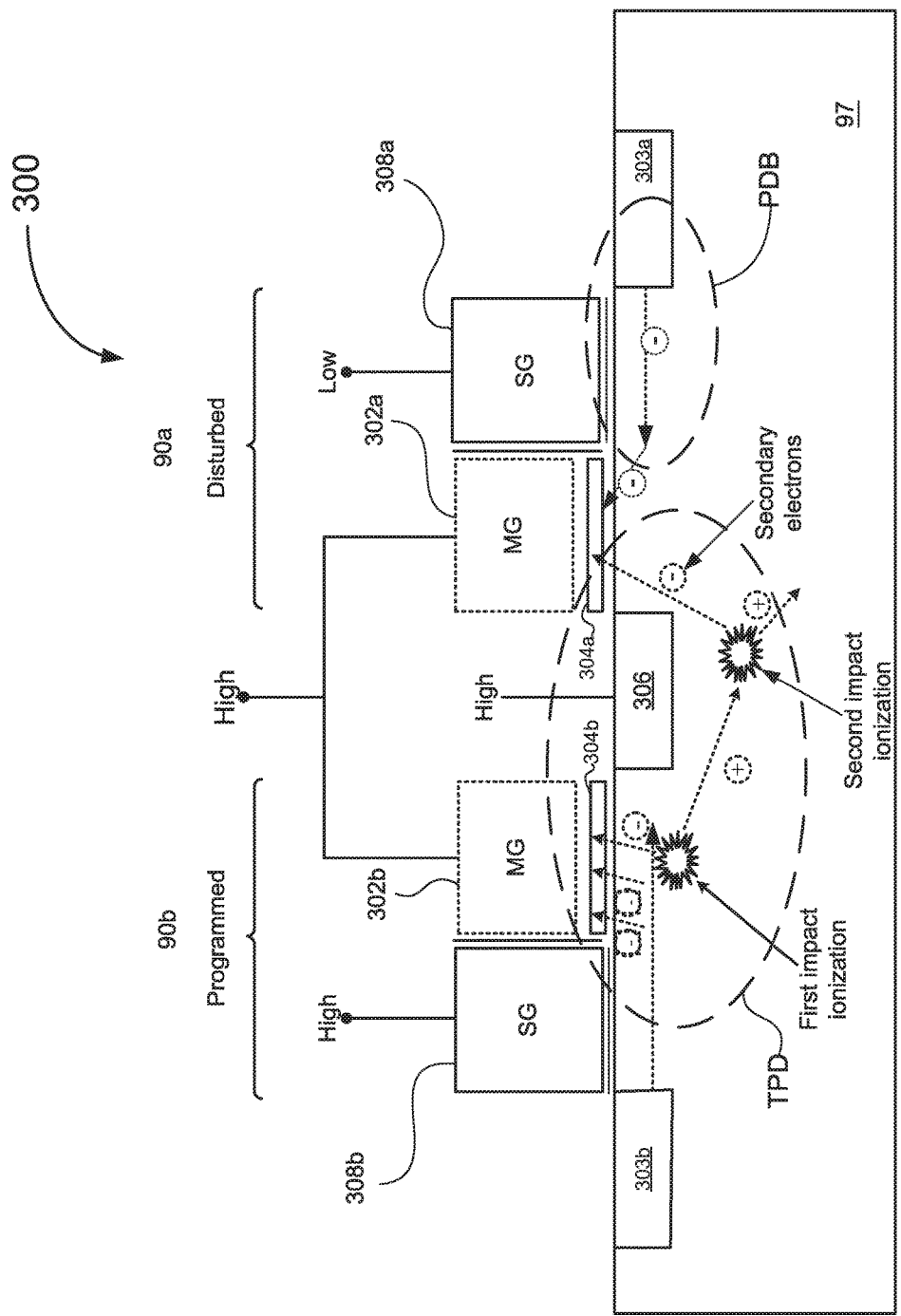
FIG. 4 is a schematic diagram illustrating program disturb in an NVM pair.

FIG. 4 illustrates program disturb effect in split gate memory pair 300. As an example for illustrative purposes and not limitation, split gate cell 90b on the left is selected for programming and split gate memory cell 90a on the right is unselected for programming (inhibit). In one embodiment, MGs 302a and 302b are coupled to the same MG driver circuit and configured to receive the same voltage.

A set of voltage differentials between different nodes and terminals (e.g., gate to drain, gate to source, gate to well, or source to drain) may be applied to the transistors of an NVM cell of a memory device (NVM device) to perform different operations (e.g., pre-program, erase, program, and or read). Operational voltages of various terminals in split gate memory pair 300, in which split gate cell 90b is selected for a program operation while split gate cell 90a is unselected, are shown in Table 1. It will be the understanding that voltages given in Table 1 and the following figures are merely exemplary for the purpose of illustration, not limitation, and may deviate according to system requirements. In other implementations, some or all of the pass transistors and/or memory transistors may be p-type transistors. Additionally, it should be appreciated that p-type transistors may have different bias voltages and different polarity of voltage potentials as those depicted in Table 1.

TABLE 1

| | | Voltage (level and sample voltages) |
|---|---|---|
| Memory cell selected for programming | MG 302b | High - 9 V |
| | SG308b | High - 1 V |
| | BL 303b | Low - 0.4 V or V@Ipgm |
| Common/Shared source line | CSL 306 | High - 5.5 V |
| Memory cell unselected for programming | MG 302a | High - 9 V |
| | SG308a | Low - 0 V |
| | BL 303a | Low - 0.4 V or V@Ipgm |

Referring to FIG. 4, since both MGs 302b and SG 308b are coupled with high voltages, the channel of split gate memory cell 90b is turned on. On the other hand, although MG 302a is positively biased, channel of split gate memory cell 90a is not turned on because SG 308a is coupled with a low voltage (below its threshold voltage $V_T$). In one embodiment, CSL 306 is coupled to a high voltage for programming. As a result, hot channel electrical charges may be injected into charge trapping layer 304b to program split gate memory cell 90b. In one embodiment, split gate memory cell 90a should remain erased (inhibited) because the channel under MG 302a is not turned on. In one embodiment, both BLs 303a and 303b are coupled with a programming voltage or current, which is a supply of voltage or current to cause split gate memory cell 90a or 90b to be programmed. In one embodiment, the voltage and/or current magnitude is typically predetermined for each NVM array, and may be denoted by Vpgm, or V@Ipgm or Ipgm. In another embodiment, similar voltages may be applied to various terminals and nodes of 2T memory pair 200 (not shown in this figure) to achieve a similar outcome of programming 2T memory cell 80b, while leaving 2T memory cell 80a erased (inhibited).

Referring again to FIG. 4, the embodiment illustrated may be subjected to two types of program disturb, viz. transient program disturb (TPD) and program disturb type B (PDB). As previously discussed, split gate memory cell 90a is not intended to be programmed since SG 308a is at an off state. However, PDB due to sub-threshold leakage of SG 308a may occur because MG 302a and CSL 306 are both coupled with a high voltage. Sub-threshold leakage current may be current across the channel (e.g., between source and drain) of a transistor when the transistor is off (e.g., voltage on the select gate is below the voltage threshold ($V_T$) of the transistor). In one embodiment, the relatively high MG-BL voltage differential (e.g. 9-0.4=8.6 V) and/or CSL-BL voltage differential (e.g. 5.5–0.4=5.1 V) in split gate cell 90a may cause hot electrons to accelerate from BL 303a towards MG 302a. In one embodiment, the hot electrons may be trapped in charge trapping layer 304a to unintentionally and at least partly program split gate memory cell 90a (disturbed).

TPD mechanism may refer to the program disturb originates from split gate memory cell 90b that is being programmed. Hot electrons in the vicinity of the injection area in the channel may induce first impact ionization near MG 302b, creating electron-hole pairs. The created electrical holes may be accelerated by the strong positive vertical field due to the high MG voltage (9V) or the positively biased CSL 306 (5.5V). The holes may become hot and induce secondary impact ionization relatively far from MG 302b (the programmed cell MG). The secondary electrons created by the second impact ionization may then be subjected to and accelerated towards the strong positive MG 302a bias (9V) of split gate memory cell 90a. Consequently, secondary electrons may accelerate and inject into charge trapping layer 304a of split gate memory cell 90a. In one embodiment, the injection of secondary electrons may partially program split gate memory cell 90a unintentionally. For illustrative and clarity purposes, specific voltage levels are shown in the example. However, it is understood that TPD and PDB may be prevalent in different operating voltages. In one embodiment, TPD and PDB effects may also be facilitated by high temperature. It is also the understanding that similar TPD and PDB effects may happen in 2T memory cell configuration, such as 2T memory pair 200 in FIG. 3A.

TPD and PDB effects may be reduced when MG 302a of unselected split gate memory cell 90a is coupled with a lower voltage, such as 4 V instead of 8.5 V. As previously discussed, the TPD mechanism may require two serial impact ionization processes in two different places in substrate 87. The likelihood of TPD happening may be very sensitive to the geometrical path between adjacent memory cells. TPD and PDB effects may become more prevalent as memory cells become smaller and packed denser. Therefore, there may be specific ways to couple/short multiple MGs and/or SLs together in a memory array to minimize the effects of TPD and PDB. Various ways of MGs and/or SLs scrambling will be discussed in later sections.

Figure 5:
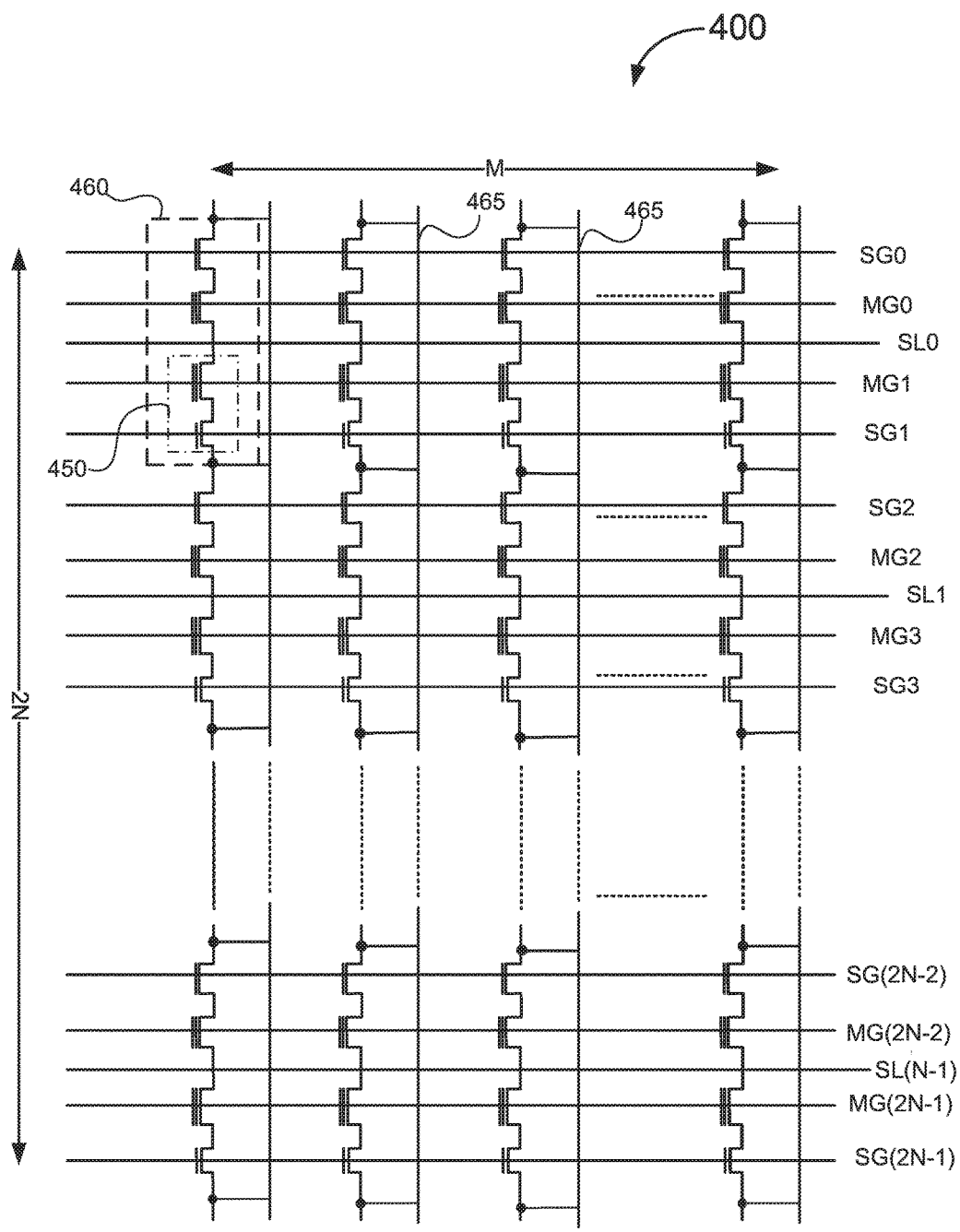
FIG. 5 is a schematic diagram illustrating an NVM array in accordance with one embodiment of the subject matter.

As previously discussed, CSL architecture may share a CSL among substantially all the NVM cells in a sector of NVM cells. In other embodiments, CSL architecture may share a CSL among substantially all the NVM cells in an NVM array. In another example, CSL architecture may share a CSL among two or more rows and or two or more columns of NVM cells in an NVM sector or array. The implementation of CSL architecture allows for a reduction of silicon area used for each memory cell. FIG. 5 illustrates memory array 400 according to one embodiment of the subject matter. In one embodiment, memory array 400 may be a portion/sector of memory array 112 of NVM device 102, as best shown in FIG. 1. In some embodiments, memory array 400 may be configured to become a NAND flash or NOR flash memory sector. As best shown in FIG. 5, memory array 400 is divided into M columns and 2N rows of memory cells 450, wherein each memory cell 450 further contains a memory transistor and a pass or select transistor. In one embodiment, each memory cell 450 may carry one bit of data. In another embodiment, each cell may carry two bits of data. In each column, memory cells 450 are coupled or connected. In one embodiment, two adjacent memory cells 450 may share SL (CSL) to form a memory pair 460, which may resemble 2T memory pair 200 or split gate memory pair 300, as best illustrated in FIGS. 3A and 3B. In one embodiment, memory pairs 460 of the same 2 rows may share the same SL. In some embodiments, each SL 0 to SL N−1 may be coupled to an individual SL driver, configured to receive potentially different operating voltages. In one embodiment, memory cells 450 of the same column, for example column 2, may share a bit line 465. In various embodiments, multiple columns and/or rows of memory cells may share the same bit line, or they may have individual bit lines 465. Bit lines 465 illustrated in FIG. 5 are for illustrative purposes only, not for limitation.

Figure 6:
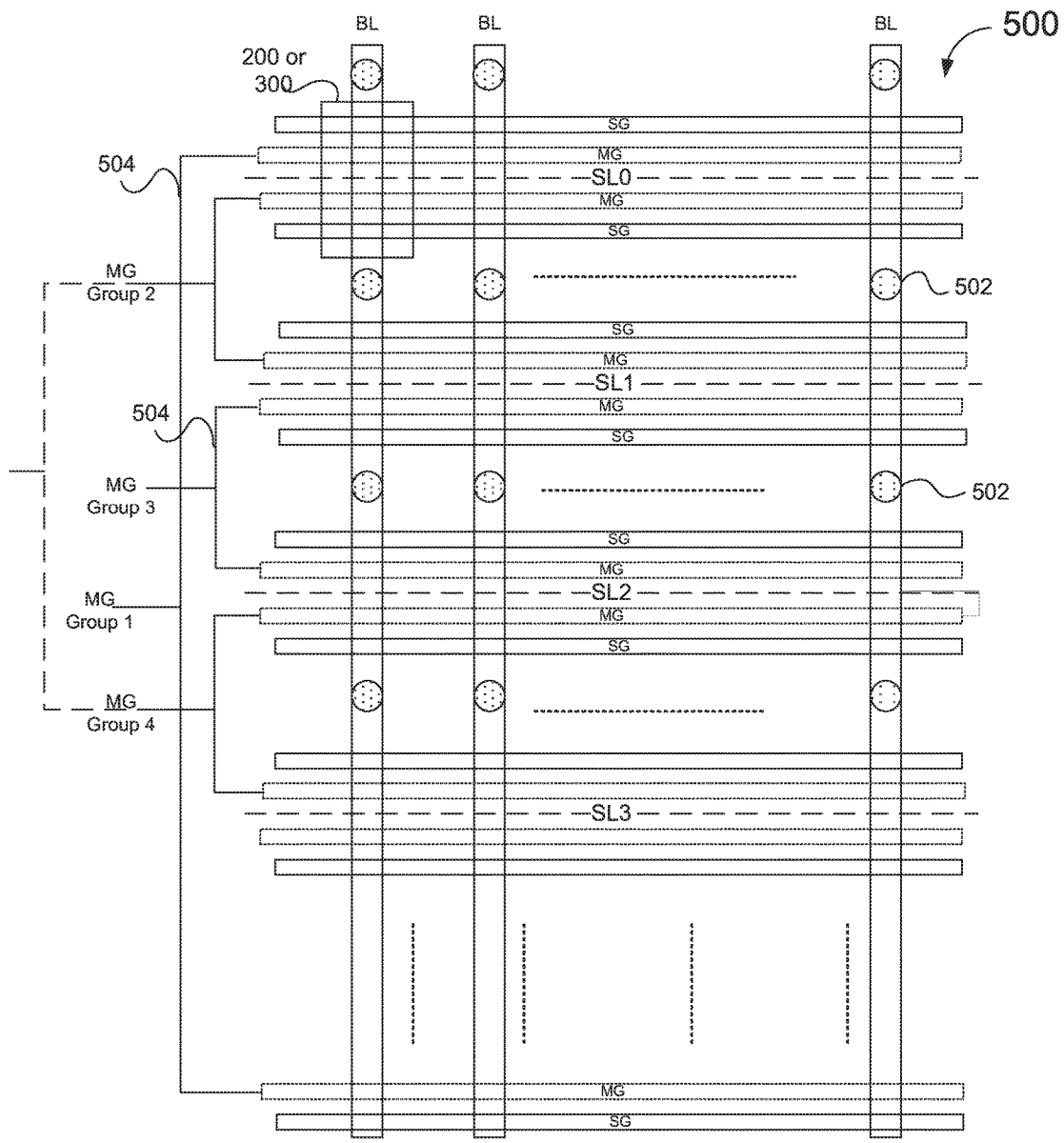
FIG. 6 is a schematic diagram illustrating a portion of an NVM array in accordance with one embodiment including memory gate (MG) line scrambling.

FIG. 6 illustrates a portion of NVM array 500 according to one embodiment of the subject matter. In one embodiment, NVM array 500 resembles memory array 400 and may be organized in rows and columns. Memory cells of the same row may share one SL and memory cells in adjacent rows of the same column may have common source (e.g. SL 1) disposed between the two MGs, resembling split gate memory pair 200 or 2T memory pair 300. Memory cells of the same row may share a common select gate (SG) line and MG line. In one embodiment, memory cells of the same column may share a common BL, and more than one BLs may be coupled to one another. In another embodiment, memory cells of the same column may be coupled to different and multiple BLs. NVM array 500 may be configured to be a flash memory array and each memory cell may be accessed randomly by row and column addresses through row and column driver circuit, such as row and column decoder 114 and 118 in FIG. 1. In some embodiments, NVM array 500 may include some dummy SG lines, MG lines, reference MG lines, or reference SLs (not shown in this figure) near the periphery of NVM array 500 for various purposes.

MGs of NVM array 500 may be coupled to relatively high voltages (>4 V) during various operations. In some embodiments, high voltage (HV) semiconductor devices, such as transistors having thick gate oxide layers, may be required in MG driver circuits to withstand the high voltages. To conserve chip area, multiple MG lines may be connected (or shorted) to one MG driver circuit. Referring to FIG. 6, in one embodiment, two adjacent MG lines may be grouped together and coupled to the same MG driver, such as MG Group 2 to 4. In one embodiment, for example MG group 2, MG lines of two NVM cells that do not share the same SL (SL0 and SL1 respectively) are coupled together, and may be configured to receive the same voltage signals from the same MG driver. In some embodiments, MG lines that share the same BL contacts 502, such as MG Group 3, may be coupled together to the same MG driver circuit. In other embodiments, different MG groups, for example MG group 2 and 4, may be coupled together to further reduce the number of MG driver circuits required. In another embodiment, MG lines of the two ends of NVM array 500, such as MG group 1, may be coupled together to the same MG driver circuit. MG connection 504 may include conductive materials, such as polysilicon wires and metal wires.

One of the benefits of grouping or scrambling MG lines as previously disclosed is that MG lines that share the same SL (for example SL2) are coupled with different MG groups (MG group 3 and 4 respectively). In one embodiment, MG group 3 and 4 may be configured to couple to different MG drivers and be biased differently, such as one to HV and the other to LV. For example, during program operation of one particular NVM cell, MG of the selected NVM cell may be biased to a HV. In one embodiment, MG of the unselected NVM cell in the same NVM pair may be biased to a low voltage even though the selected and unselected NVM cells share a SL (for example SL2), which may be biased to a HV.

As best shown in FIG. 4 and as previously explained, program disturb of the unselected NVM cell due to TPD and PDB may be much reduced or minimized if the MG of the unselected NVM cell is configured to receive a LV signal.

Figure 7:
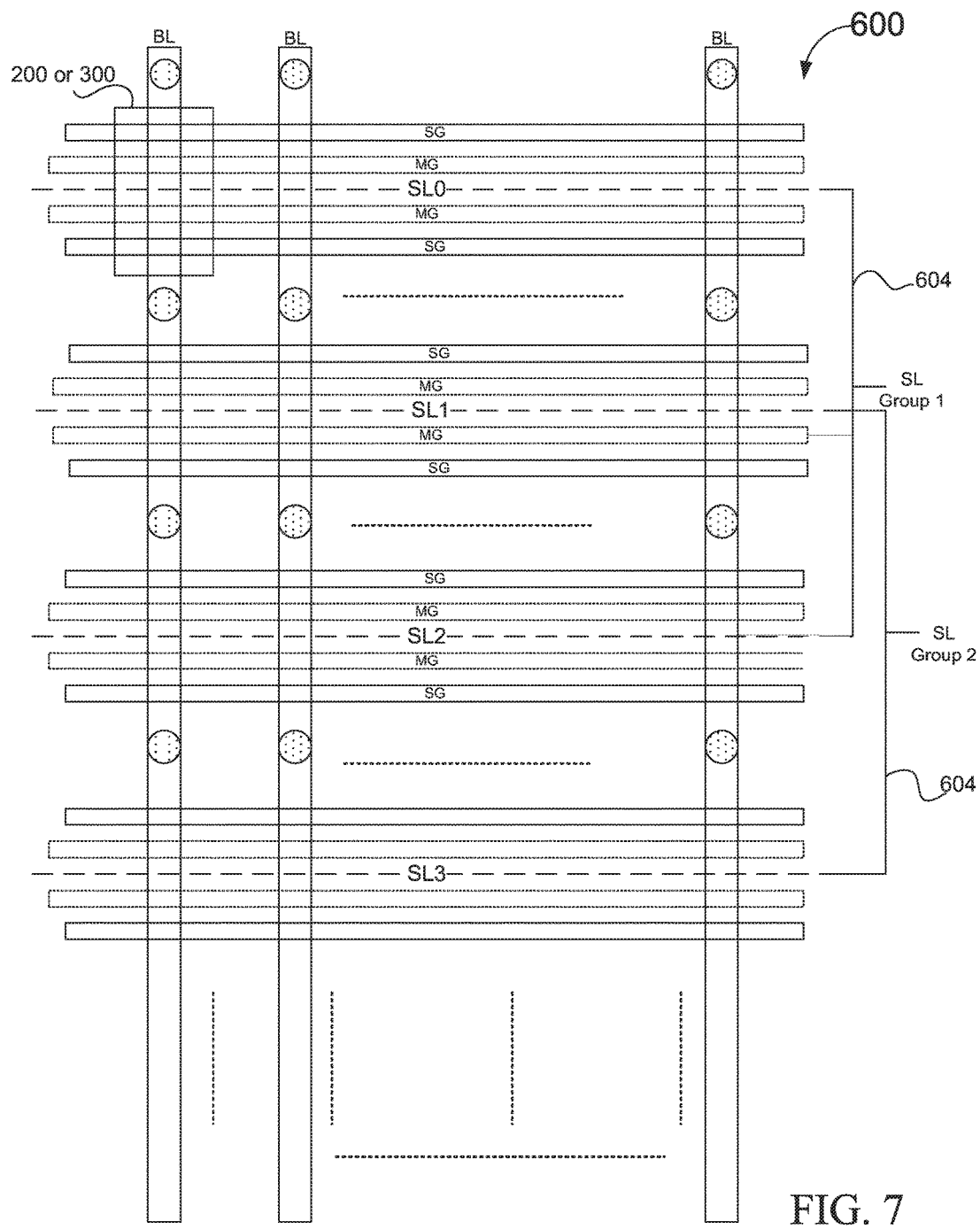
FIG. 7 is a schematic diagram illustrating a portion of an NVM array in accordance with one embodiment including source line (SL) scrambling.

FIG. 7 illustrates a portion of NVM array 600 according to one embodiment of the subject matter. In one embodiment, NVM array 600 resembles memory array 400 and NVM cells may be organized in rows and columns. NVM cells of the same row may share one SL and NVM cells in adjacent rows of the same column may have a common source (e.g. SL 1) disposed between the two MGs, resembling split gate memory pair 200 or 2T memory pair 300. In one embodiment, memory cells of the same column may share a common BL, and more than one BL may be coupled to one another. In another embodiment, NVM cells of the same column may be coupled to different and multiple BLs. NVM array 500 may be configured to be a flash memory array and each NVM cell may be accessed randomly by row and column addresses through row and column driver circuit, such as row and column decoder 114 and 118 in FIG. 1. In some embodiments, NVM array 600 may include some dummy SG lines, MG lines, reference MG lines, or reference SL (not shown in this figure) near the periphery of NVM array 600 for various purposes.

SLs of NVM array 600 may be coupled to relatively high voltages (>4 V) during various operations. In some embodiments, high voltage (HV) semiconductor devices, such as transistors having thick gate oxide layers, may be required in SL driver circuits to withstand the high voltages. To conserve chip area, multiple SLs may be connected (or shorted) to one SL driver circuit. In one embodiment, SLs of NVM circuit 600 may be divided into two groups, viz. the odd and even groups. The odd group may include SL1, SL3, SL5 . . . and the even group may include SL0, SL2, SL4, SL6, . . . . In one embodiment, the general concept of the two groups is that adjacent SLs are not grouped together. SLs of the even group or SL group 1 and the odd group or SL group 2 may be coupled together by SL connection 604. SL groups 1 and 2 may be coupled to two different SL drivers and configured to receive different voltage signals for various operations of NVM cells. In one embodiment, SL connection or routing 604 may include conductive materials, such as polysilicon wires and metal wires. In other embodiments, SLs of NVM array 600 may include more than two SL groups as long as each SL group does not contain adjacent SLs. Each SL group may be coupled to the same SL driver or a different one.

Similar to the previously discussed MG lines scrambling, SLs scrambling may help to reduce the number of SL driver circuits, and hence the required chip area. In one embodiment, SLs scrambling may help avoid having HV signals on both SL and MG of an unselected NVM cell during programming of its adjacent NVM cell. Therefore, program disturb stemming from TPD and PDB on the unselected NVM cells for programming may be reduced or minimized.

Figure 8A:
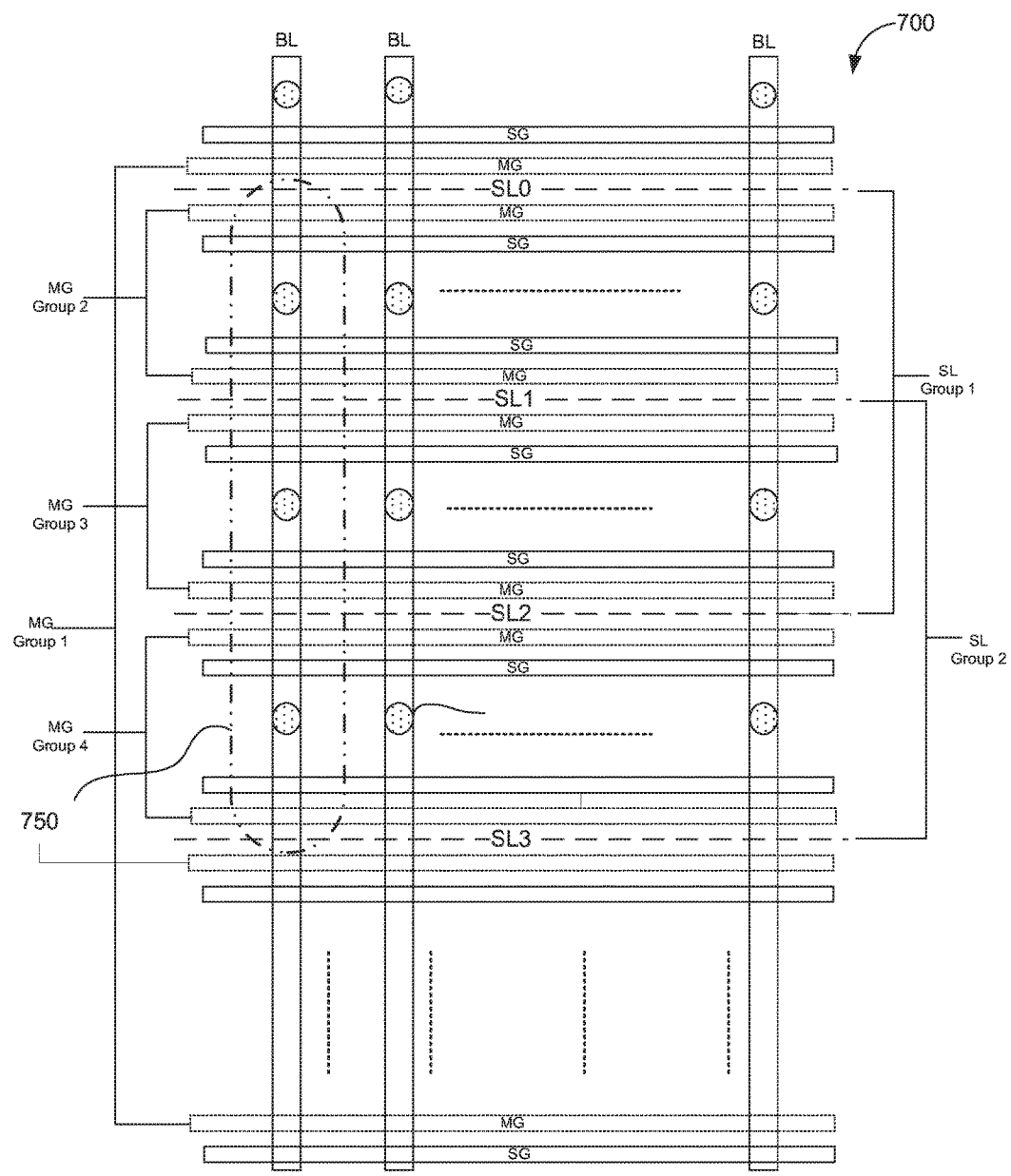
FIG. 8A is a schematic diagram illustrating a portion of an NVM array in accordance with one embodiment including MG line and SL scrambling.

FIG. 8A illustrates a portion of NVM array 700 according to one embodiment of the subject matter. In one embodiment, NVM array 700 implements the MG lines scrambling disclosed in FIG. 6 and the SLs scrambling disclosed in FIG. 7, simultaneously.

Figure 8B:
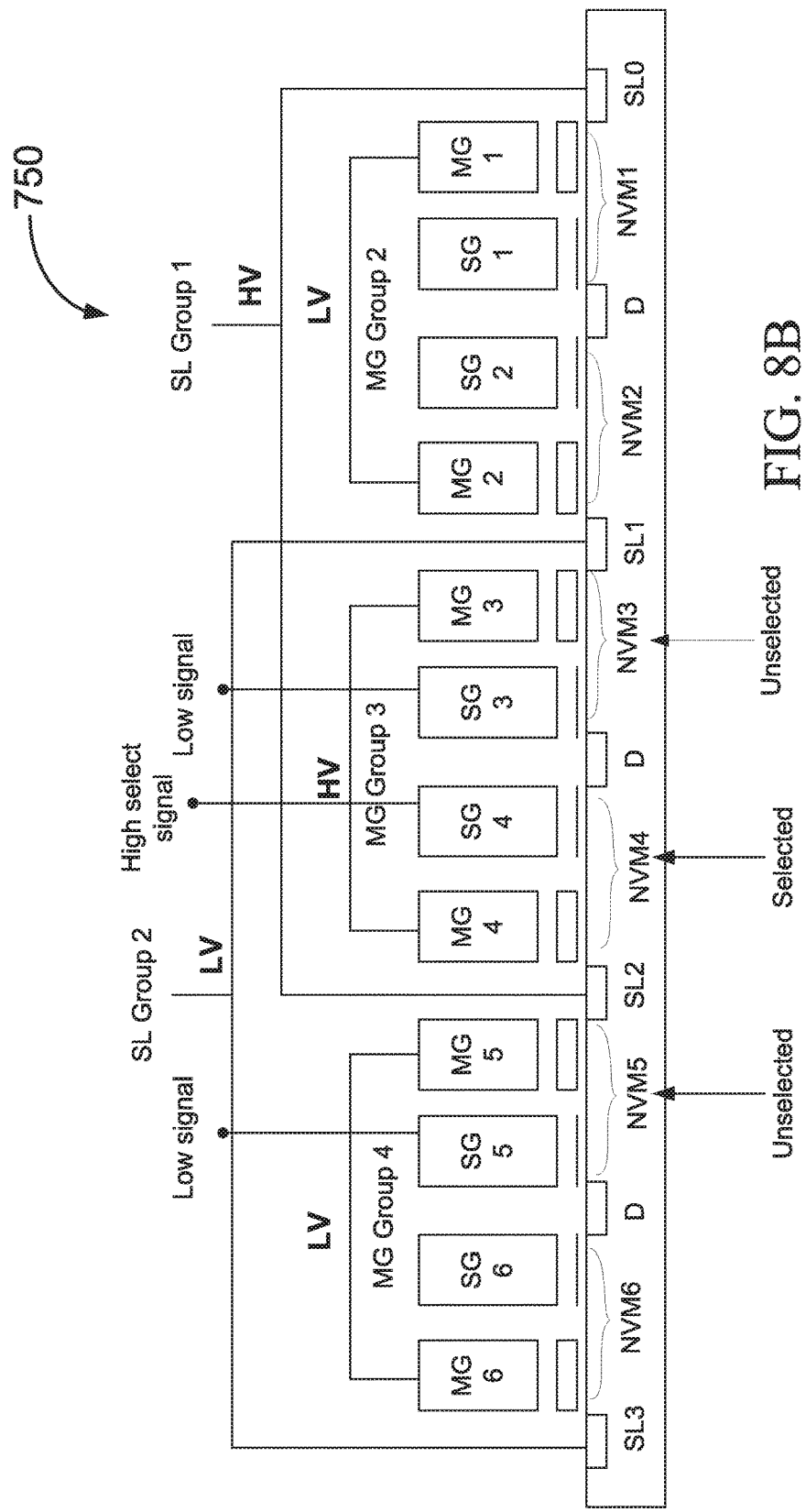
FIG. 8B is a schematic diagram illustrating a portion of one column of NVM cells in accordance with one embodiment of the subject matter.

FIG. 8B illustrates a representative schematic view of a portion 750 of NVM array 700 in FIG. 8A, which includes six adjacent NVM cells in the same column. As shown in FIG. 8B, NVM 2 and NVM 3 share a source (SL 1), NVM 4 and NVM 5 share SL 2. SL 1 and SL 2 are adjacent to one another. As an example for illustrative purposes only, NVM 4 may be selected for programming, NVM 3 and NVM 5 are unselected (inhibited). SG 4 may be turned on (above $V_T$) for programming and SG 3 and SG 5 turned off (below $V_T$). In one embodiment, both MG group 3 (MG 4) and SL group 1 (SL 2) are biased to their respective HV to program MG 4. As previously discussed, HV biasing in unselected MGs may contribute to higher chance and degree of program disturb caused by TPD and PDB. In one embodiment, MG 5 (unselected) may be biased to LV since it is coupled to a different MG group (i.e. MG group 4), which may be coupled to a different MG driver circuit than MG group 3. As also shown in FIG. 8B, NVM 3 is also unselected for programming. In one embodiment, SG 3 may be biased below its $V_T$ to shut down the channel of NVM 3. However, MG 3 may still be biased to HV because it belongs to MG group 3. In these embodiments, SL group 2 may be coupled to LV, such that source of the unselected cell NVM 3 (SL1) is biased to LV to reduce program disturb. In one embodiment, SL and MG scrambling may be implemented in a manner that SLs and MGs of any unselected NVMs, such as NVM 5 and NVM 3, may not be biased to their respective HV concurrently. It is the understanding that voltage levels in these specific example is for illustrative purposes only, not limitation.

Figure 8C:
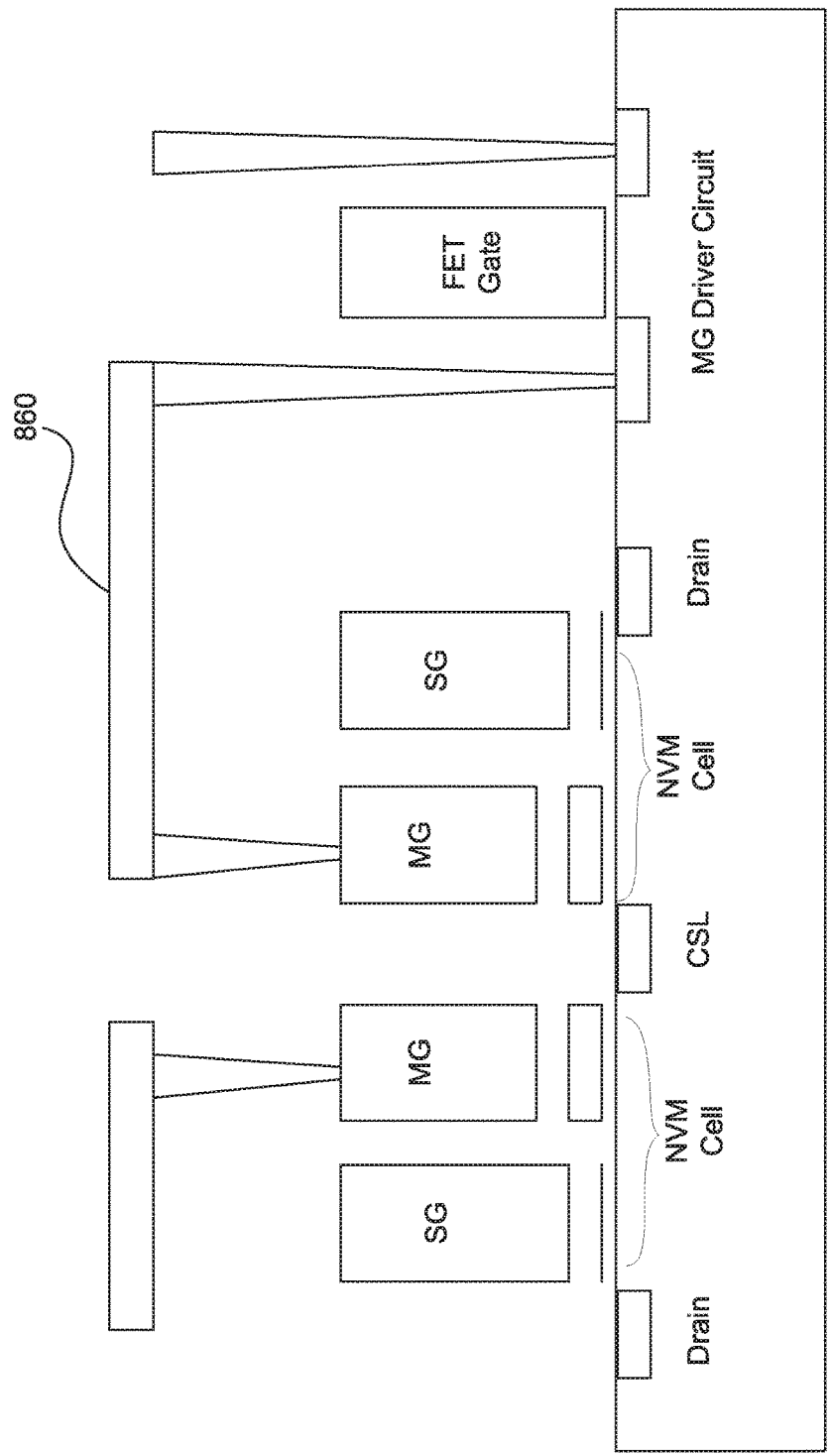
FIG. 8C is a schematic diagram illustrating one embodiment of MG line connection routing.

FIG. 8C illustrates one embodiment of connection routing to MG driver circuit. In one embodiment, MG line is connected to MG driver transistor drain junction using metal 1 (M1) and/or poly only. This configuration may help avoid process charging of NVM cells in the array. With this connection configuration, MGs of NVM cells are free of process charging for back end of line process steps of VIA1 and above.

Figure 9:
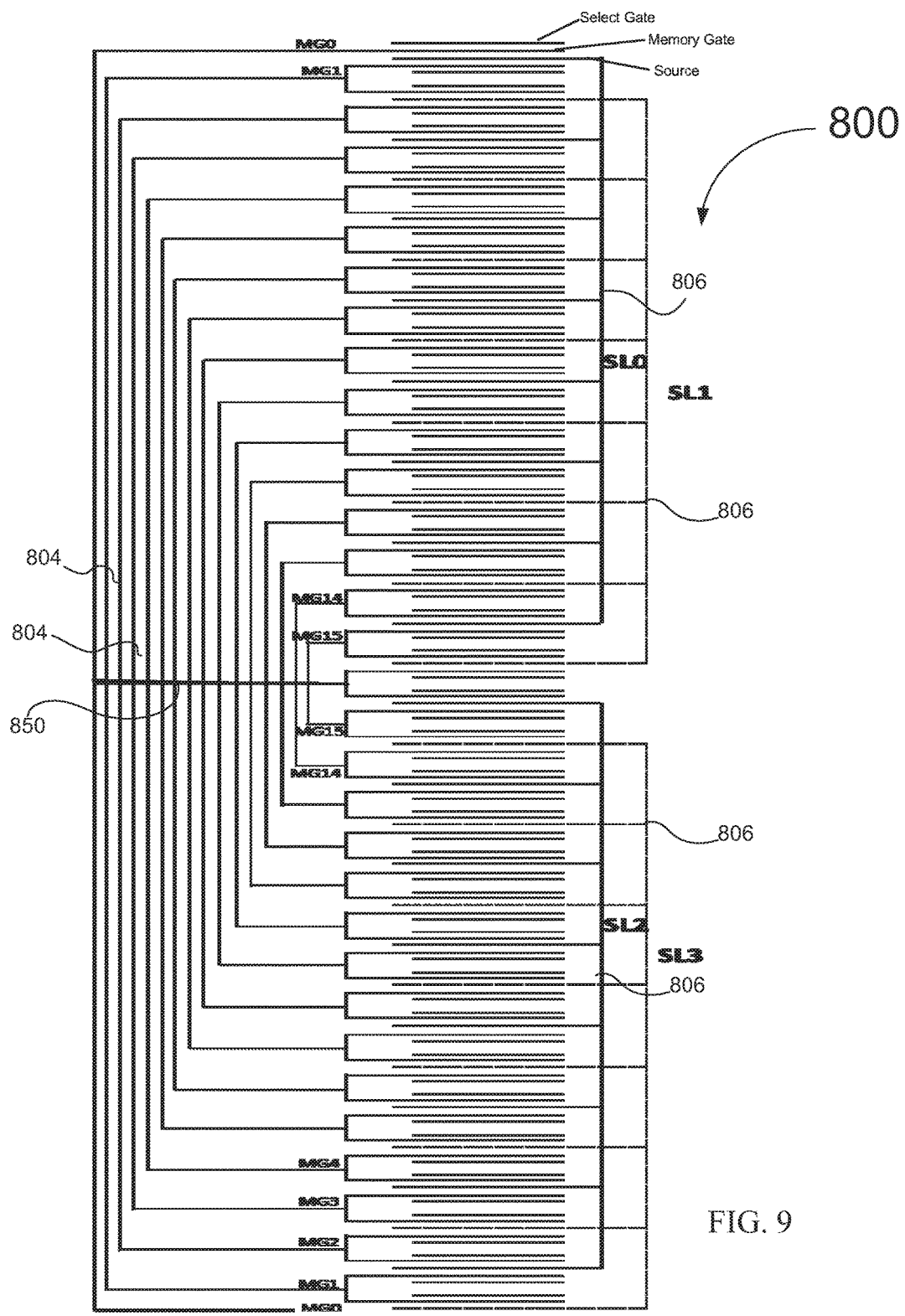
FIG. 9 is a schematic diagram illustrating a portion of an NVM array in accordance with one embodiment including MG line and SL scrambling.

FIG. 9 illustrates another embodiment of NVM array 800 according to the subject matter. In one embodiment, there are 64 NVM cells in one column, and two adjacent MGs may share one SL. Two adjacent MGs in the same column that do not share the same SL may be coupled together, and two MG line groups on two side of NVM array 800 are further coupled to one another, such as MG 1, MG 2, etc. In one embodiment, each MG line group may include four MG lines. Connection routing 804 of MG line groups MG 1-MG 15, which may be all M1 connection, may not cross one another. As best shown in FIG. 9, the two MG lines that are at the edges of NVM array 800 (edge pair) are coupled together in one MG line group (MG 0), and then further coupled to the two MG lines in the middle of NVM array 800, such as the two MG lines between MG line group MG15. In one embodiment, the edge pair may be connected to any regular central MG line pairs via conducting line bridge 850. Conducting line bridge 850 may allow the edge pair to couple other MG pairs in the center of NVM array 800 without shorting or cutting the other MG line groups, such as MG 1, MG 2. In one embodiment, conducting line bridge 850 may be made of polysilicon or metal wires. According to system requirements, each MG line group (MG 0-MG 15) may be connected to a different MG driver circuit. Alternatively, some MG line groups may be further coupled together and connected to one MG driver circuit to further conserve chip area.

Referring to FIG. 9, SLs are scrambled in a similar configuration as discussed in FIG. 7, wherein odd SLs and even SLs are coupled together. In one embodiment, eight of the odd SLs (SL 1, SL 3, . . . SL 15) in the upper half of NVM array 800 are coupled together by SL connection routing 806 to form SL group SL 1. Similarly, eight even SLs (SL 0, SL 2, . . . , SL 14) in the upper half are coupled together to form SL group SL 0. In one similar embodiment, SL groups SL 2 and SL 3 are formed in the bottom half of NVM array 800. Each of the SL groups SL 0-SL 3 may be connected to its own SL driver circuit such that odd and even SLs may receive different voltage signals. In another embodiment, some of the SL groups may be coupled to the same SL driver circuit to conserve chip area, or according to other system requirements.

The embodiment shown in FIG. 9 demonstrate how MG line and/or SL scrambling or grouping may help reduce or minimize program disturb on unselected NVM cells. Since MGs and/or SLs of unselected NVM cells may not be biased to HV concurrently, TPD and PDB effects on unselected NVM cells may be much reduced. It is the understanding that, although a specific size and configuration of array is shown for clarity, as is known in the art, a wide variety of size and configuration may be implemented.

Figure 10:
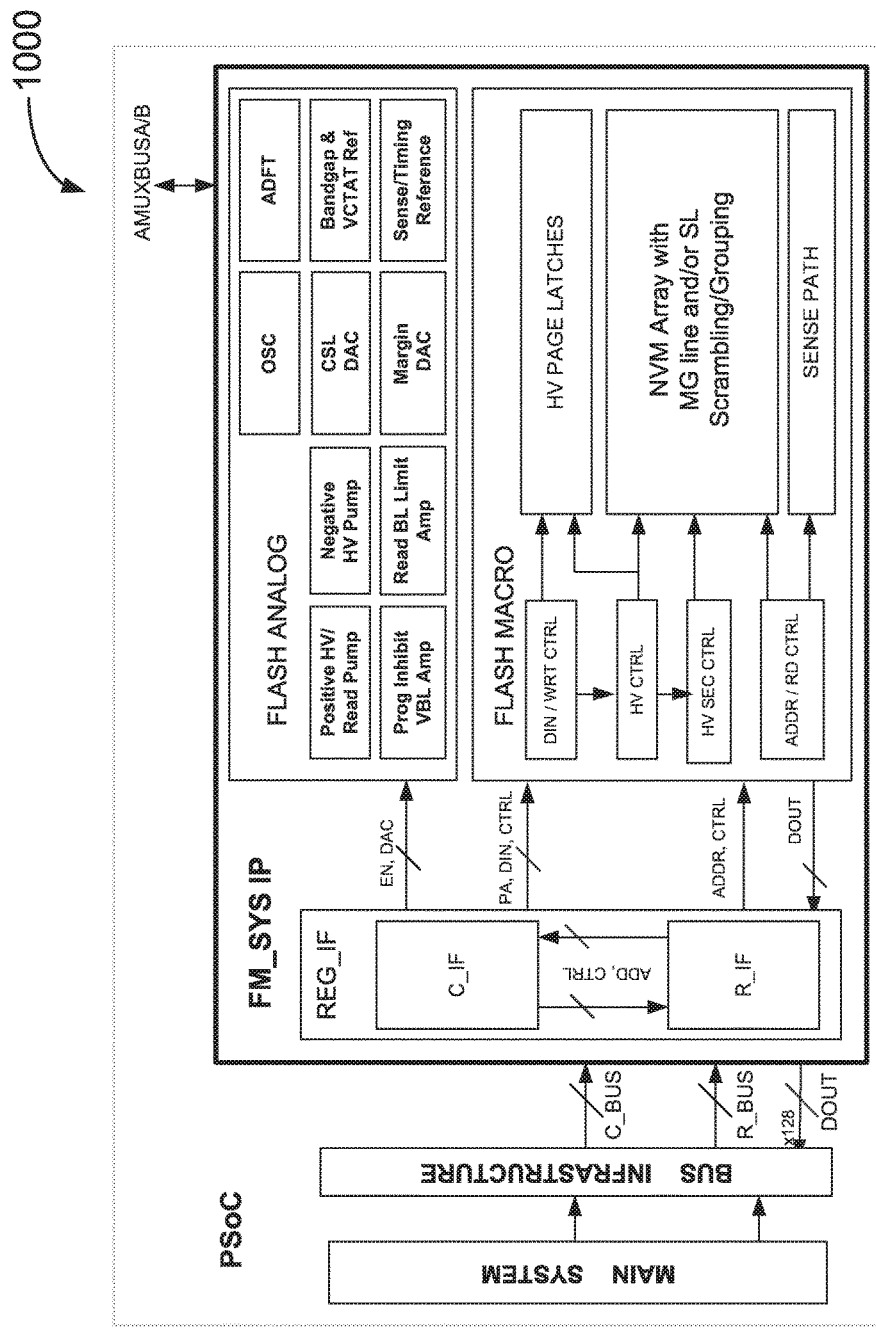
FIG. 10 is a schematic diagram illustrating an NVM system in accordance with one embodiment of the subject matter.

FIG. 10 is a block diagram illustrating a non-volatile memory system, according to another embodiment. Circuit 1000 is another NVM system in which the current disclosure may operate. Circuit 100 includes a memory array with memory gate lines and/or common source lines scrambling or grouping.

Figure 11:
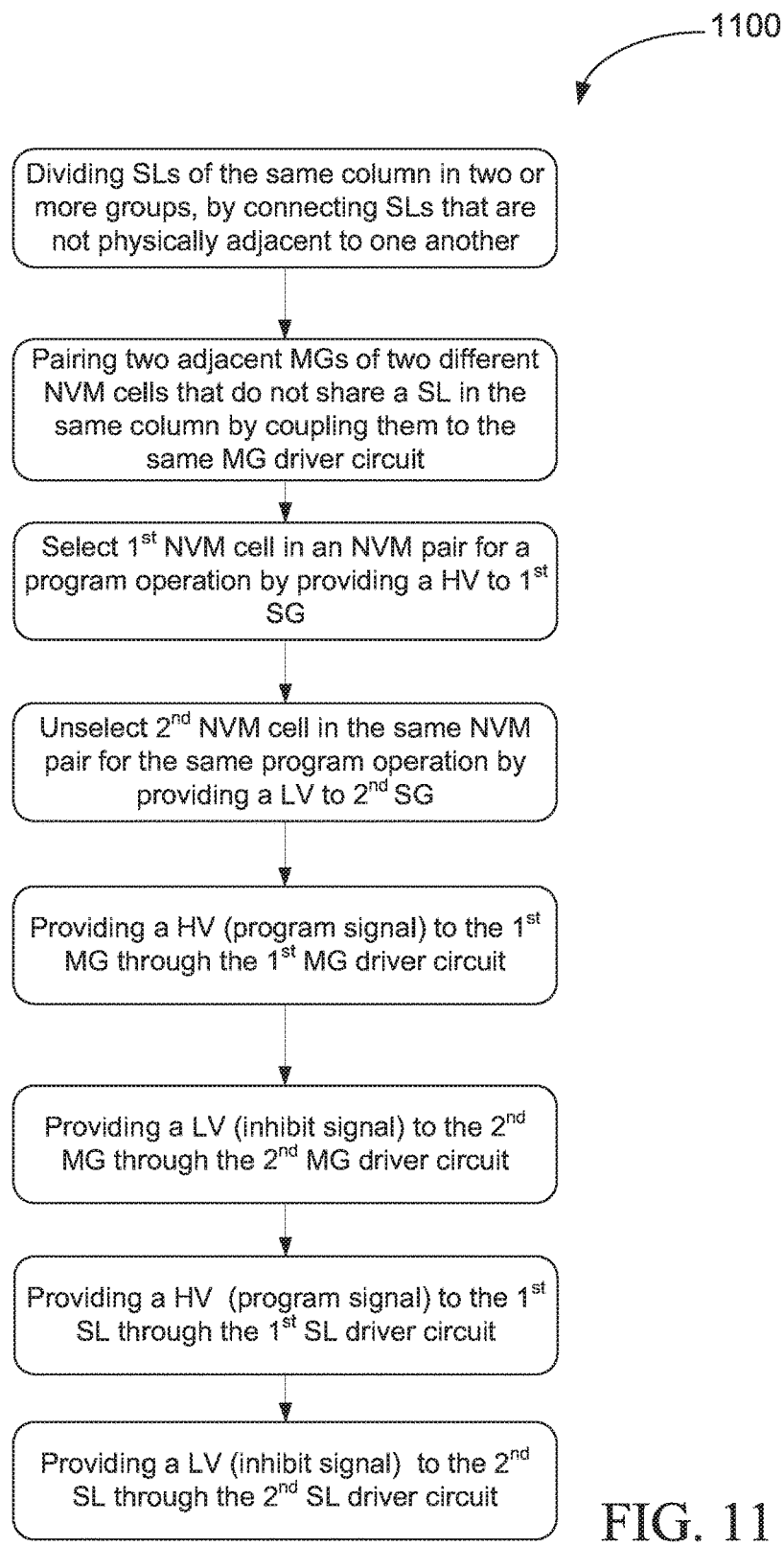
FIG. 11 is a flow chart illustrating program operations of an NVM array or system in accordance with one embodiment of the subject matter.

FIG. 11 is a representative flow chart illustrating a method of programming one or more NVM cell according to one embodiment of the subject matter. Referring to FIG. 11, a first NVM cell of a NVM array, such as NVM array 700 or 800, is selected for a program operation. In one embodiment, the first NVM cell may be any NVM cells in the NVM array. As discussed previously, the first NVM cell may share SL with a second NVM cell in the same NVM pair, such as 200 or 300. Their respective MGs may however be grouped separately and connected to two different MG driver circuits. SL (first SL) shared by the first and second MGs may also be electrically isolated from its two adjacent SLs. In one embodiment, when first NVM cell is selected for programming and second NVM cell is unselected, first SG may be biased above its $V_T$ and second SG below its $V_T$. To program first NVM cell, first MG may then be provided with a HV program signal. Second MG may be provided with a LV inhibit signal from its own MG driver circuit, such that program disturb from TPD and PDB may be reduced or minimized. In one embodiment, SL shared by first and second MGs may be coupled to a HV signal for programming the first NVM cell. The program disturb to second NVM cell may be minimized, despite the high voltage being applied to the first SL. It is because the second MG is biased to a low inhibit voltage. Similarly, MGs that shared the same MG driver circuit as the first MG will be provided with the same HV program signal. In one embodiment, SLs of the unselected MGs may not be grouped with the first SL, such that a low inhibit voltage from separate SL drivers may be provided to them to reduce the potential program disturb effects. In one embodiment, multiple MG lines share the same MG driver may be biased to the same HV if one of the NVM cells is selected for programming. In these embodiments, NVM cells in different MG lines that share the same MG driver circuit may be grouped into different source line groups, thus coupling to different SL driver circuits. During the program operation, the selected NVM cell may have both its MG and source region biased to a HV. The unselected NVM cells may also be provided with a HV signal due to sharing the same MG driver as the selected NVM cell. The unselected NVM cells may have its SLs biased to a LV to minimize effects of program disturb.

Embodiments of the subject matter include various operations described herein. These operations may be performed by hardware components, software, firmware, or a combination thereof.

Although the present disclosure has been described with reference to specific exemplary embodiments, it will be evident that various modifications and changes may be made to these embodiments without departing from the broader spirit and scope of the disclosure. Accordingly, the specification and drawings are to be regarded in an illustrative rather than a restrictive sense.

The Abstract of the Disclosure is provided to comply with 37 C.F.R. § 1.72(b), requiring an abstract that will allow the reader to quickly ascertain the nature of one or more embodiments of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

Reference in the description to one embodiment or an embodiment means that a particular feature, structure, or characteristic described in connection with the embodiment is included in at least one embodiment of the circuit or method. The appearances of the phrase one embodiment in various places in the specification do not necessarily all refer to the same embodiment.

In the foregoing specification, the subject matter has been described with reference to specific exemplary embodiments thereof. It will, however, be evident that various modifications and changes may be made thereto without departing from the broader spirit and scope of the subject matter as set forth in the appended claims. The specification and drawings are, accordingly, to be regarded in an illustrative sense rather than a restrictive sense.

What is claimed is:

1. A memory device, comprising:
a memory array arranged in rows and columns, including,
at least four non-volatile memory (NVM) cells coupled in a same column of the memory array, wherein each NVM cell includes a memory gate, and wherein first and second NVM cells of the at least four NVM cells share a first source line and third and fourth NVM cells share a second source line, wherein the first and second source lines are adjacent to one another,
wherein the memory gates of the first and second NVM cells are not electrically coupled with one another, wherein the first and second source lines are not electrically coupled with one another, and wherein each of the first and second source lines is physically connected with at least one source line of the same column that is not the first and second source lines.

2. The memory device of claim 1, wherein the memory array is at least partly formed by coupling a plurality of the at least four NVM cells, wherein a first plurality of the at least four NVM cells are coupled to form a first column of the memory array, and wherein pattern of the first column is repeated in at least one remaining columns of the memory array.

3. The memory device of claim 2, wherein configurations of the rows and the columns of the memory array are reversed.

4. The memory device of claim 1, wherein the first and second NVM cells include a mirrored orientation, the first and second memory gates face one another, and the first source line disposed between the first and second memory gates, and wherein the third and fourth NVM cells include the mirrored orientation, the third and fourth memory gates face one another, and the second source line disposed between the third and fourth memory gates.

5. The memory device of claim 1, wherein the at least four NVM cells include a split gate memory cell configuration.

6. The memory device of claim 1, wherein the at least four NVM cells include a two-transistor memory cell configuration, and wherein the two-transistor memory cell includes one field-effect-transistor, and one silicon-oxide-nitride-oxide-silicon transistor or one floating gate transistor.

7. The memory device of claim 1, wherein when the first memory cell is selected for a program operation and the second memory cell is not selected for the program operation, the first and second memory gates are configured to receive a high voltage and a low voltage from two different memory gate driver circuits, respectively.

8. The memory device of claim 1, wherein when the second memory cell is selected for a program operation and the third memory cell is not selected for the program operation, the second and third memory gates are configured to receive a high voltage, wherein the first and second source lines are configured to receive a high source voltage and a low source voltage, respectively from two different source line driver circuits.

9. The memory device of claim 8, wherein the high voltage is in an approximate range of 5 V to 10 V, and the low voltage in an approximate range of 0 V to 5 V.

10. A memory array, comprising:
non-volatile memory (NVM) cells, each including a memory gate and a select gate, arranged in rows and columns, wherein,
two adjacent NVM cells of a same column that share a source region form an NVM pair, wherein the source region is disposed between memory gates of the two adjacent NVM cells, and wherein multiple NVM pairs are coupled to one another in the same column,
at least two memory gates of NVM cells of a same row share a memory gate line,
at least two source regions of NVM cells of the same row share a source line; and
source line connection routing configured to connect multiple source lines physically and electrically to form multiple source line groups, wherein the multiple source lines in a same source line group are not physically adjacent to one another.

11. The memory array of claim 10, wherein:
at least two select gates of NVM cells of the same row share a select gate line; and
at least two drain regions of NVM cells of the same column share a bit line, wherein the drain region of each of the NVM cells is disposed adjacent to the select gate.

12. The memory array of claim 10, wherein each of the multiple source line groups is coupled with a separate source line driver circuit, configured to receive a separate source voltage.

13. The memory array of claim 10, further comprising:
memory gate connection routing configured to connect multiple memory gate lines electrically to form multiple memory gate line groups, wherein the multiple memory gate lines in a same memory gate line group do not share any source line that is in a same source line group, and wherein each of the multiple memory gate line groups is coupled with a separate memory gate line driver circuit, configured to receive a separate memory gate voltage.

14. The memory array of claim 13, wherein the NVM cells in the multiple source lines in a same source line group do not include memory gate lines that are in the same memory gate line group.

15. The memory array of claim 10 comprising 2N rows of NVM cells, N being a natural number, wherein:
multiple odd source lines including $1^{st}$ to $(N-1)^{th}$ source lines are connected electrically by a first source line connection routing;
multiple even source lines including $0^{th}$ to $(N-2)^{th}$ source lines are connected electrically by a second source line connection routing; and
the first and second source line connection routings are coupled to two different source line driver circuits.

16. The memory array of claim 10 comprising 2N rows of NVM cells, N being a natural number, wherein:
$0^{th}$ and $(2N-1)^{th}$ memory gate lines are connected electrically by a first memory gate line connection routing;
at least one remaining odd memory gate line is connected electrically to its adjacent even memory gate line by a second memory gate line connection routing; and
the first and the second memory gate line connection routing are each coupled to a separate memory gate driver circuit.

17. The memory array of claim 13, wherein the memory gate connection routing includes metal 1 (M1) connection to the memory gate driver circuit.

18. The memory array of claim 10, wherein the NVM cells include two-transistor memory cells.

19. The memory array of claim 10, wherein the NVM cells include split gate memory cells.

20. A method, comprising:
providing a non-volatile memory (NVM) array, wherein the non-volatile memory array includes at least four non-volatile memory (NVM) cells coupled in a same column of the NVM array, wherein each NVM cell includes a memory gate and a select gate, wherein first and second NVM cells of the at least four NVM cells share a first source line, and third and fourth NVM cells share a second source line, and wherein the first and second source lines are each physically connected with at least another source line that is not physically adjacent to the first and second source lines respectively;
coupling a high select voltage to a first select gate to select the first memory cell for a program operation;
coupling a low select voltage to a second select gate to unselect the second memory cell for the program operation;
coupling a high program voltage to the first memory gate and a low inhibit voltage to the second memory gate; and
coupling two different source voltages to the first source line and the second source line from two different source line driver circuits, respectively.

21. The method of claim 20, wherein the memory gates of the second and third NVM cells are electrically connected, and wherein the first and second source lines are physically adjacent to one another.

* * * * *